US010802071B2

(12) United States Patent
Leobandung

(10) Patent No.: US 10,802,071 B2
(45) Date of Patent: Oct. 13, 2020

(54) ELEMENTAL MERCURY-CONTAINING PROBE CARD

(71) Applicant: INTERNATIONAL BUSINESS MACHINES CORPORATION, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 33 days.

(21) Appl. No.: 15/829,633

(22) Filed: Dec. 1, 2017

(65) Prior Publication Data
US 2019/0170815 A1      Jun. 6, 2019

(51) Int. Cl.
*G01R 31/28*      (2006.01)
*G01R 1/067*      (2006.01)

(52) U.S. Cl.
CPC ..... *G01R 31/2887* (2013.01); *G01R 1/06755* (2013.01); *G01R 31/2893* (2013.01)

(58) Field of Classification Search
CPC ....... H01L 2224/45014; H01L 2924/14; H01L 2224/484; H01L 2224/1403; H01L 2224/14051; H01L 2224/73203; H01L 2224/16227; G01R 1/07342; G01R 31/2887; G01R 31/2891; G01R 31/2889; G01R 31/2886; G01R 1/0735; G01R 1/07378; G01R 1/06716; G01R 1/07314; G01R 31/2863; G01R 31/2893; G01R 31/31905; G01R 1/07357; G01R 1/06744; G01R 1/07307; G01R 31/2831; G01R 1/0491; G01R 1/067; G01R 1/06711; G01R 1/06738; G01R 1/06772; G01R 1/06733; G01R 1/073; G01R 31/26; G01R 31/2868; G01R 31/2884; G01R 31/318511; G01R 1/0416; G01R 1/06794; G01R 1/07392; G01R 31/002; G01R 31/2834; G01R 31/2851; G01R 31/2865; G01R 31/2879; G01R 31/2881; G01R 31/307; H01R 12/57; H01R 12/718; H01R 2201/20; H01R 12/52; H01R 12/7076; H01R 12/714; H01R 13/5025; H01R 13/631; G06F 17/5068; G06F 11/221
See application file for complete search history.

(56) References Cited

U.S. PATENT DOCUMENTS 2,947,939 A * 8/1960 Harwig ................ G01N 27/041
                                              324/722
3,794,912 A    2/1974 Severin et al.
4,101,830 A    7/1978 Greig
4,521,730 A    6/1985 Shulman
(Continued)

*Primary Examiner* — Vinh P Nguyen
(74) *Attorney, Agent, or Firm* — L. Jeffrey Kelly

(57) ABSTRACT

A probe card apparatus for wafer testing of a wafer under test, and a method of using the probe card for wafer testing. The probe card includes a printed circuit board having wafer testing circuitry. The probe card also includes a probe array including a slab having a plurality of probes, wherein each probe includes a volume of electrically-conductive fluid contained within a corresponding perforation of the slab that extends between a first surface and a second surface of the slab, wherein a first surface of each volume of electrically-conductive fluid substantially coincides with the first surface of the slab.

20 Claims, 4 Drawing Sheets

(56) References Cited

U.S. PATENT DOCUMENTS

| | | | |
|---|---|---|---|
| 5,436,571 A * | 7/1995 | Karasawa | G01R 31/2891 |
| | | | 324/750.19 |
| 5,585,736 A | 12/1996 | Hshieh et al. | |
| 5,969,534 A * | 10/1999 | Hubner | G01R 1/06783 |
| | | | 324/754.04 |
| 6,483,328 B1 | 11/2002 | Eldridge et al. | |
| 6,900,652 B2 | 5/2005 | Mazur | |
| 6,913,476 B2 * | 7/2005 | Yean | G01R 1/06783 |
| | | | 439/178 |
| 7,064,566 B2 | 6/2006 | Khandros et al. | |
| 7,253,649 B1 | 8/2007 | Chen | |
| 8,183,878 B2 | 5/2012 | Sekino | |
| 8,870,579 B1 * | 10/2014 | Weiss | H05K 3/32 |
| | | | 324/755.08 |
| 9,310,396 B2 * | 4/2016 | Li | G01R 1/06783 |
| 2001/0054905 A1 | 12/2001 | Khandros et al. | |
| 2004/0224369 A1 * | 11/2004 | Cai | C12Q 1/001 |
| | | | 435/7.7 |
| 2007/0170934 A1 * | 7/2007 | Ma | G01R 31/2831 |
| | | | 324/754.14 |
| 2011/0043239 A1 * | 2/2011 | Tomita | G01R 1/0735 |
| | | | 324/756.03 |
| 2012/0143531 A1 * | 6/2012 | Davey | G01N 33/48785 |
| | | | 702/51 |

\* cited by examiner

ELEMENTAL MERCURY-CONTAINING PROBE CARD

BACKGROUND

The present invention relates generally to the field of semiconductor device fabrication, and in particular to semiconductor device testing and a probe card apparatus and method for enhancing probe array contact during wafer testing.

Wafer testing, otherwise referred to as wafer-level testing, wafer probing, wafer sort, wafer final test, circuit probing, electronic die sort, and the like, may be performed in semiconductor device fabrication by way of a testing apparatus such as a wafer prober to test and verify proper functionality and operation of a device under test, such as a wafer, chip, or die.

The wafer prober may establish an interconnected electrical circuit with a wafer under test for and during testing. During testing, electrical test signals may be applied by the wafer prober with respect to the wafer under test by way of the interconnected electrical circuit, for determination of a level of functionality of the wafer under test. The wafer prober may include, for example, an electromechanically docked or otherwise attached probe card including conducting elements such as probes, probe needles, or the like. An arrangement of the conducting elements may be, for example, patterned to enable substantially uniform contact between the conducting elements of the probe card and bond pads, contact pads, test pads, interconnects, or the like, of the wafer under test during testing, thereby enabling the testing of the wafer under test, accordingly.

SUMMARY

A probe card apparatus for wafer testing. The probe card includes a probe array including a slab having a plurality of probes, wherein each probe includes a volume of electrically-conductive fluid contained within a corresponding perforation of the slab that extends between a first surface and a second surface of the slab, wherein a first surface of each volume of electrically-conductive fluid substantially coincides with the first surface of the slab.

A method of using a probe card apparatus for wafer testing. The method includes loading a wafer under test into a wafer prober, the wafer including a plurality of solder bumps and the wafer prober including a test head interconnected to the probe card. The method further includes aligning the probe card with respect to the wafer based on a pattern formed by the plurality of solder bumps, the pattern being formed with respect to one or more surfaces of the wafer, and testing the wafer by causing contact between probes of the probe card and the plurality of solder bumps, wherein the caused contact establishing an electromechanical interface between the wafer prober and the wafer during testing. The method may use the disclosed apparatus.

BRIEF DESCRIPTION OF THE DRAWINGS

The following detailed description, given by way of example, is not intended to limit the invention solely thereto, and will be best appreciated in conjunction with the accompanying Figures.

The Figures are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
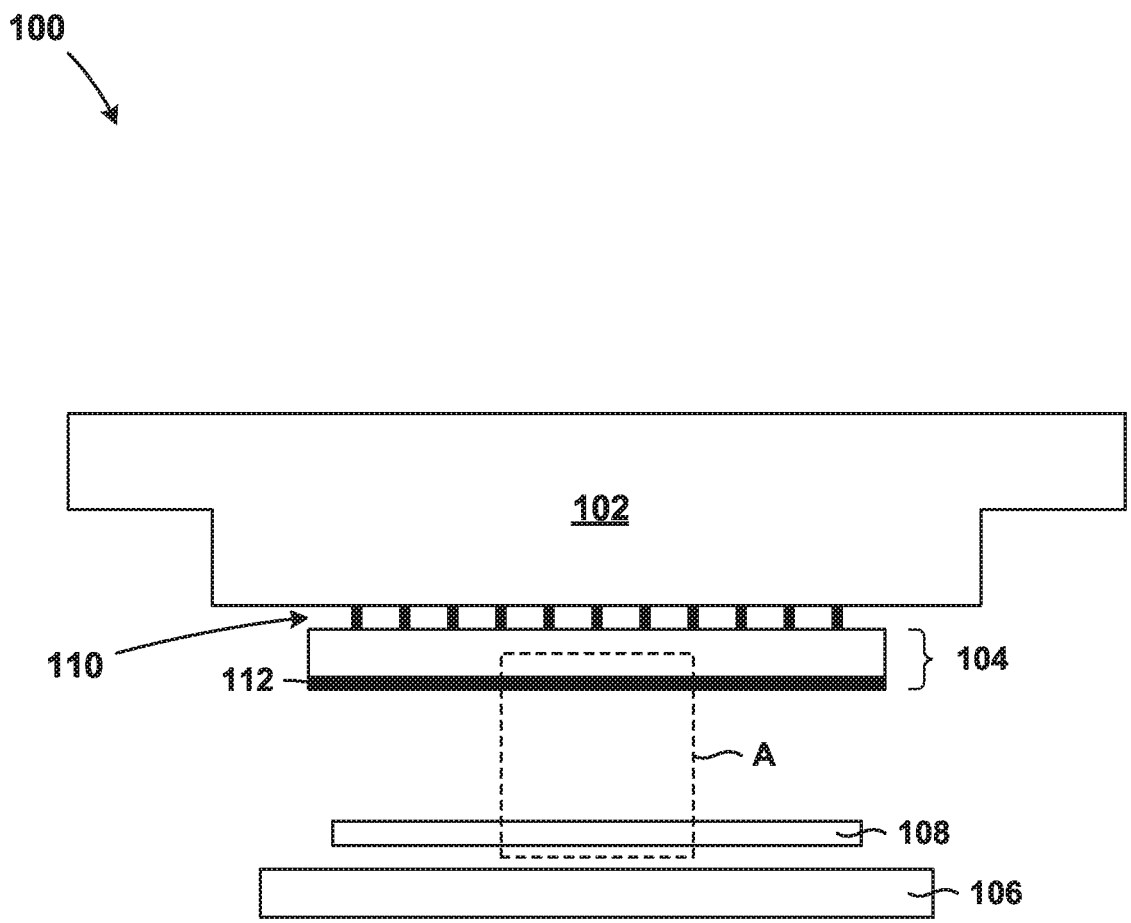
FIG. 1 depicts a cross-sectional view of a portion of a test apparatus during an intermediate step of a method of wafer testing, in accordance with an embodiment of the present invention.

Detailed embodiments of the present invention are disclosed herein for purposes of describing and illustrating claimed structures and methods that may be embodied in various forms, and are not intended to be exhaustive in any way, or limited to the disclosed embodiments. Many modifications and variations will be apparent to those of ordinary skill in the art without departing from the scope and spirit of the disclosed embodiments. The terminology used herein was chosen to best explain the principles of the one or more embodiments, practical applications, or technical improvements over current technologies, or to enable those of ordinary skill in the art to understand the embodiments disclosed herein. As described, details of well-known features and techniques may be omitted to avoid unnecessarily obscuring the embodiments of the present invention.

References in the specification to "one embodiment," "an embodiment," "an example embodiment," or the like, indicate that the embodiment described may include one or more particular features, structures, or characteristics, but it should be understood that such particular features, structures, or characteristics may or may not be common to each and every disclosed embodiment of the present invention herein. Moreover, such phrases do not necessarily refer to any one particular embodiment per se. As such, when one or more particular features, structures, or characteristics is described in connection with an embodiment, it is submitted that it is within the knowledge of those skilled in the art to affect such one or more features, structures, or characteristics in connection with other embodiments, where applicable, whether or not explicitly described.

For purposes of the description hereinafter, the terms "upper," "lower," "right," "left," "vertical," "horizontal," "top," "bottom," "perpendicular," "parallel," and the like, and any derivatives or variations thereof, relate to the disclosed structures and methods as depicted and oriented in the accompanying Figures, accordingly. The terms "overlying," "atop," "on top," "positioned on," or "positioned atop," should be understood to mean that a first element such as a first structure is present on a second element such as a second structure, where intervening elements such as an interface structure may or may not be present between the first element and the second element. The term "direct contact" should be understood to mean that a first element such as a first structure and a second element such as a second structure are connected without intervening conducting layers, insulating layers, or semiconducting layers at the interface of the two elements.

In the interest of not obscuring disclosure of embodiments of the present invention, the following detailed description may contain certain processing steps or operations that are known in the art, which may have been combined for purposes of clear description and illustration. In some instances, certain processing steps or operations that are known in the art may not be described in detail, and/or may not be described at all. It should be understood that the following disclosure of embodiments of the present invention is focused on distinctive elements, features, structures, or characteristics thereof.

In some types of wafer testing, the controlled collapse chip connection method, also known as its abbreviation "C4," or as "flip chip," may be implemented. The method may utilize solder bumps which may be deposited on bond pads of a wafer under test, for contact with an electromechanical interface of a wafer prober during testing. The electromechanical interface may be formed, for example, by a collective of conducting elements of a probe card of the wafer prober. During testing, mutual and uniform contact between the solder bumps and the electromechanical interface produces an interconnected electrical circuit between the wafer under test and the wafer prober for testing. Some types of probe cards utilize probe needles to form the conducting elements, such as cantilever-type probe cards, epoxy ring-type probe cards, vertical-type probe cards, and the like. Such types of probe cards impose various requirements and limitations on a manner of performing the wafer testing, due to the design and structure of the probe needles utilized.

For example, tips or contact points of an array of probe needles forming the electromechanical interface require planarization, such that during testing, a plane defined by each of the contact points matches a plane defined by surfaces of the bond pads, or otherwise matches a plane defined by surfaces of the solder bumps deposited on the bond pads of the wafer under test. A sufficiently planarized array of probe needles allows for a substantially equal contact pressure to be exerted by each of the contact points on each of the bond pads during testing. The sufficiently planarized array of probe needles further allows for a substantially equal amount of electrical resistance to be produced between each respective probe needle and bond pad, in turn producing an effective electromechanical interface for use during testing. An insufficiently planarized array of probe needles causes unequal contact pressure to be exerted and produces an unequal amount of electrical resistance across the electromechanical interface, in turn producing an ineffective electromechanical interface during testing. The insufficiently planarized array of probe needles may damage or destroy the wafer under test during test, resulting in losses and added costs to an already high-cost step in semiconductor device fabrication.

Generally, the sufficiently planarized array of probe needles is difficult to achieve in practice, and is becoming increasingly difficult to achieve due to decreasing sizes and increasing component densities of integrated circuits such as those in wafers such as the wafer under test. Results of the decreasing sizes and the increasing component densities, with respect to wafer testing, include decreasing bond pad sizes and bond pad pitches, and increasing bond pad densities per unit area on the wafers such as the wafer under test, necessitating scaling of the probe cards to match, and tighter tolerances to be met. The scaling of the probe cards utilizing the probe needles is limited by the design and structure of the probe needles, due to the decreasing amounts of applied mechanical stress able to be withstood and the higher rates of wear incurred by the probe needles with continued downscaling. Further, the scaling of the density of the array of probe needles to match the increasing component densities necessitates greater forces and pressures to be exerted by each of the contact points on each of the bond pads during testing, which may exacerbate the aforementioned issues brought about by the scaling.

Embodiments of the present invention are directed to a method and probe card apparatus for facilitating probe array contact during wafer testing. The probe card apparatus is attachable to automated test equipment such as a wafer prober for use in wafer testing. The probe card apparatus includes an elastomeric slab having a pattern of perforations. Each of the perforations form a probe of a probe array of the probe card apparatus, and the pattern of perforations matches a pattern formed by a plurality of solder bumps of a wafer under test, for colocation of the perforations and the plurality of solder bumps during wafer testing. Each probe may include a perforation forming a volume containing an electrically conducting fluid, and each volume may be open on a surface of the slab facing the wafer under test during wafer testing, such that contact caused during wafer testing between the surface of the slab and the wafer under test may establish an electromechanical interface between the wafer prober and the wafer under test by corresponding contact between the electrically conducting fluid of the probe array and the plurality of solder bumps. The elastomeric slab may be deformable upon application on the wafer under test during testing to enable contact between the probe array and the plurality of solder bumps to thereby establish the electromechanical interface.

Advantageously, the method and probe card apparatus for enhancing probe array contact according to the present disclosure overcome the aforementioned requirements and limitations associated with the use of probe cards utilizing probe needles for wafer testing. The probe card is more easily scalable. Further, the method and probe card enable smaller forces and pressures to be exerted during testing relative to probe cards utilizing physical probe needles. To that end, embodiments of the present invention enable more effective, efficient, and reliable wafer testing, thereby reducing losses caused by damaged or destroyed devices and erroneous or inconclusive test results.

FIG. 1 depicts a cross-sectional view of a portion of test apparatus 100 during an intermediate step of a method of wafer testing, in accordance with an embodiment of the present invention. Test apparatus 100 may include test head 102 interconnected to probe card 104, and chuck 106.

Test apparatus 100 represents a testing apparatus usable to perform device testing on a device such as a wafer under test. In various embodiments of the present invention, test apparatus 100 may be, for example, a wafer prober usable to perform wafer testing on wafer under test 108. In the various embodiments, test apparatus 100 may include testing, instrumentation, and control systems including hardware and software components by which to spatially orient and position probe card 104 relative to wafer under test 108, to establish an interconnected electrical circuit with wafer under test 108 for and during testing, accordingly. In the various embodiments, probe card 104 may be used, for example, as an electromechanical interface by which to establish the interconnected electrical circuit. In the various embodiments, test apparatus 100 may control spatial orientation and positioning of probe card 104 by way of test head 102 and of wafer under test 108 by way of chuck 106, with respect to patterns formed by contact points of probes of probe card 104 and bond pads or solder bumps of wafer under test 108, respectively. The patterns may be respectively formed, for example, on mutually-facing surfaces probe card 104 and wafer under test 108. Spatial orientation and positioning may occur along or about one or more of the X-, Y-, and Z-axes of a three-dimensional Cartesian coordinate system defined with respect to test apparatus 100, as depicted in FIG. 1. Generally, a type of orientation and positioning system used in test apparatus 100, such as one using optical and electromechanical systems and techniques, or the like, may be chosen as a matter of design.

Test head 102 represents testing hardware of test apparatus 100 used in facilitating wafer testing on wafer under test 108, such as by way of attached tooling. In an embodiment of the present invention, test head 102 may include, for example, wafer testing circuitry including components such as a multilayered printed circuit board, load board, or the like, for connection to corresponding wafer testing circuitry of tooling such as probe card 104. In the embodiment, the connection may be formed, for example, by a spring pin tower including pogo pins 110.

Probe card 104 represents testing hardware of test apparatus 100, such as the tooling attachable to test head 102 to perform wafer testing on wafer under test 108. In an embodiment of the present invention, probe card 104 may be, for example, a probe card apparatus including substrate 112, usable as the electromechanical interface in the wafer prober to establish the interconnected electrical circuit between test apparatus 100 and wafer under test 108 for and during testing, accordingly. In the embodiment, probe card 104 may be, for example, electromechanically attached to test head 102 by way of pogo pins 110.

Chuck 106 represents testing hardware of test apparatus 100 used in facilitating wafer testing on wafer under test 108. In an embodiment of the present invention, chuck 106 may include, for example, a stage or surface for mounting wafer under test 108 in a substantially planar configuration, for spatially orienting and positioning wafer under test 108 under control of test apparatus 100 for and during testing, accordingly. In the embodiment, chuck 106 may be, for example, a vacuum chuck, or the like.

Figure 2:
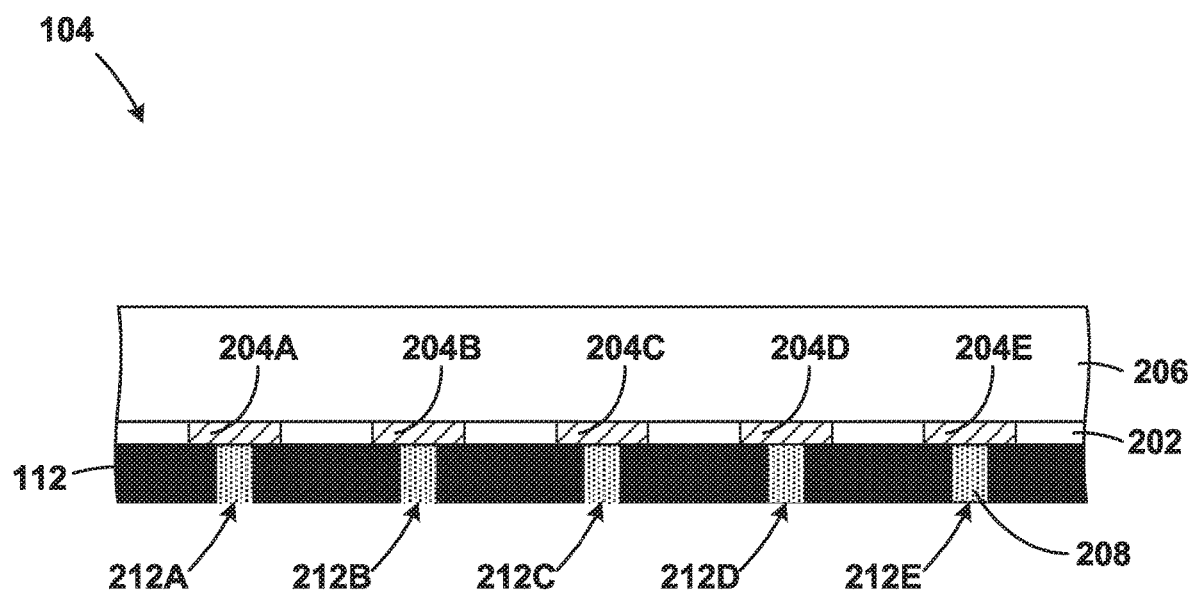
FIG. 2 depicts a cross-sectional view of a portion of a probe card, in accordance with an embodiment of the present invention.

FIG. 2 depicts a cross-sectional view of a portion of probe card 104, in accordance with an embodiment of the present invention. Probe card 104 may include printed circuit board 202 interconnected to substrate 112 and space transformer 206, respectively.

In an embodiment of the present invention, probe card 104 may be, for example, electromechanically attached to test head 102 by way of space transformer 206. In the embodiment, printed circuit board 202 may include, for example, wafer testing circuitry connectable to the wafer testing circuitry of test head 102, such as by way of connection of space transformer 206 to the spring pin tower including pogo pins 110. In the embodiment, printed circuit board 202 may include, for example, fixtures 204A-E for functional electromechanical attachment and connection on a top surface to space transformer 206. In the embodiment, fixtures 204A-E may alternatively or additionally be used for functional electromechanical attachment and connection on a bottom surface to substrate 112. In the embodiment, substrate 112 may be formed as part of, for example, a wafer probing test fixture. Space transformer 206 may include, for example, an interposer having interposer probes, each individually attached at one end to one of fixtures 204A-E, and at the other end to electrical contacts of an electrical connector of space transformer 206. The electrical connectors of space transformer 206 may be used, for example, in the connection of space transformer 206 to the spring pin tower including pogo pins 110 of test apparatus 100, thereby facilitating connection of the wafer testing circuitry of test head 102 to the wafer testing circuitry of printed circuit board 202, accordingly.

In an embodiment of the present invention, substrate 112 may be, for example, a slab, block, or sheet of material. In the embodiment, the material may be, for example, an elastomeric material. In the embodiment, substrate 112 may include, for example, fluid-containing volumes 212A-E. In the embodiment, fluid-containing volumes 212A-E may be arranged about substrate 112 to form a pattern of perforations, through holes, or the like. In the embodiment, the pattern of perforations may match a pattern formed by fixtures 204A-E, for colocation therewith in attachment of substrate 112 to printed circuit board 202, as depicted in FIG. 2. In the embodiment, the pattern of perforations may be formed, for example, by application of reactive-ion etching, laser ablation, sputtering, or drilling to substrate 112, accordingly. Substrate 112 may be attached to printed circuit board 202 by way of, for example, an adhesive, or the like.

In an embodiment of the present invention, fluid-containing volumes 212A-E may respectively contain, for example, electrically conductive fluid 208. In the embodiment, electrically conductive fluid 208, as contained within each fluid-containing volume 212A-E, may form a probe array of probe card 104, usable collectively to establish the electromechanical interface. In the embodiment, electrically conductive fluid 208 may be, for example, elemental mercury (Hg). In the embodiment, electrically conductive fluid 208 may otherwise be any other type of fluid having electrically conductive properties sufficient to establish the electromechanical interface, such as when contained within fluid-containing volumes 212A-E at standard conditions for temperature and pressure. In the embodiment, electrically conductive fluid 208 may be introduced into each respective volume 212A-E by, for example, application of a vacuum or negative pressure with respect to substrate 212, effective to draw the fluid into each volume 212A-E, accordingly. In the embodiment, each volume 212A-E may be, for example, uniform in width or thickness. In the embodiment, volumes 212A-E may each be, for example, respectively sealed about fixtures 204A-E at a proximal end, and open at a distal end, as depicted in FIG. 2. That is, volumes 212A-E may be sealed against, and in a direction facing printed circuit board 202, and open about a face of substrate 112, and in a direction facing away from printed circuit board 202. In the embodiment, electrically conductive fluid 208 may be contained within each volume 212A-E by, for example, capillary action. In the embodiment, each volume 212A-E may function as a probe of probe card 104. In the embodiment, volumes 212A-E may collectively function as an array of probes of probe card 104 for use in wafer testing. In the embodiment, volumes 212A-E may be formed in substrate 212 so as to include a probe pitch compatible with wafer under test 108 for testing, accordingly.

Figure 3A:
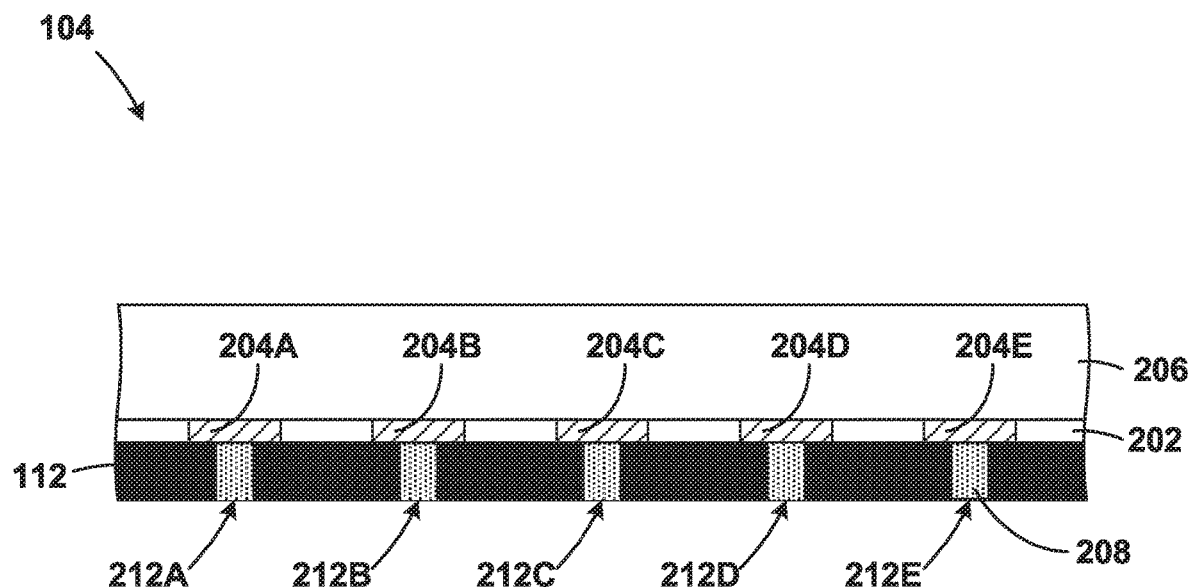
FIGS. 3A and 3B depict a section view, section A, with respect to test apparatus of FIG. 1 during intermediate steps of a method of wafer testing, in accordance with an embodiment of the present invention.
Figure 3A:
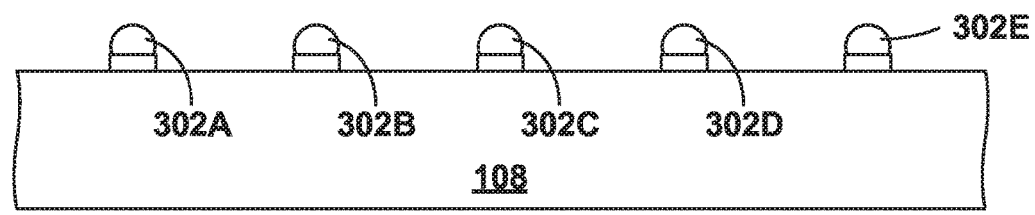
Figure 3B:
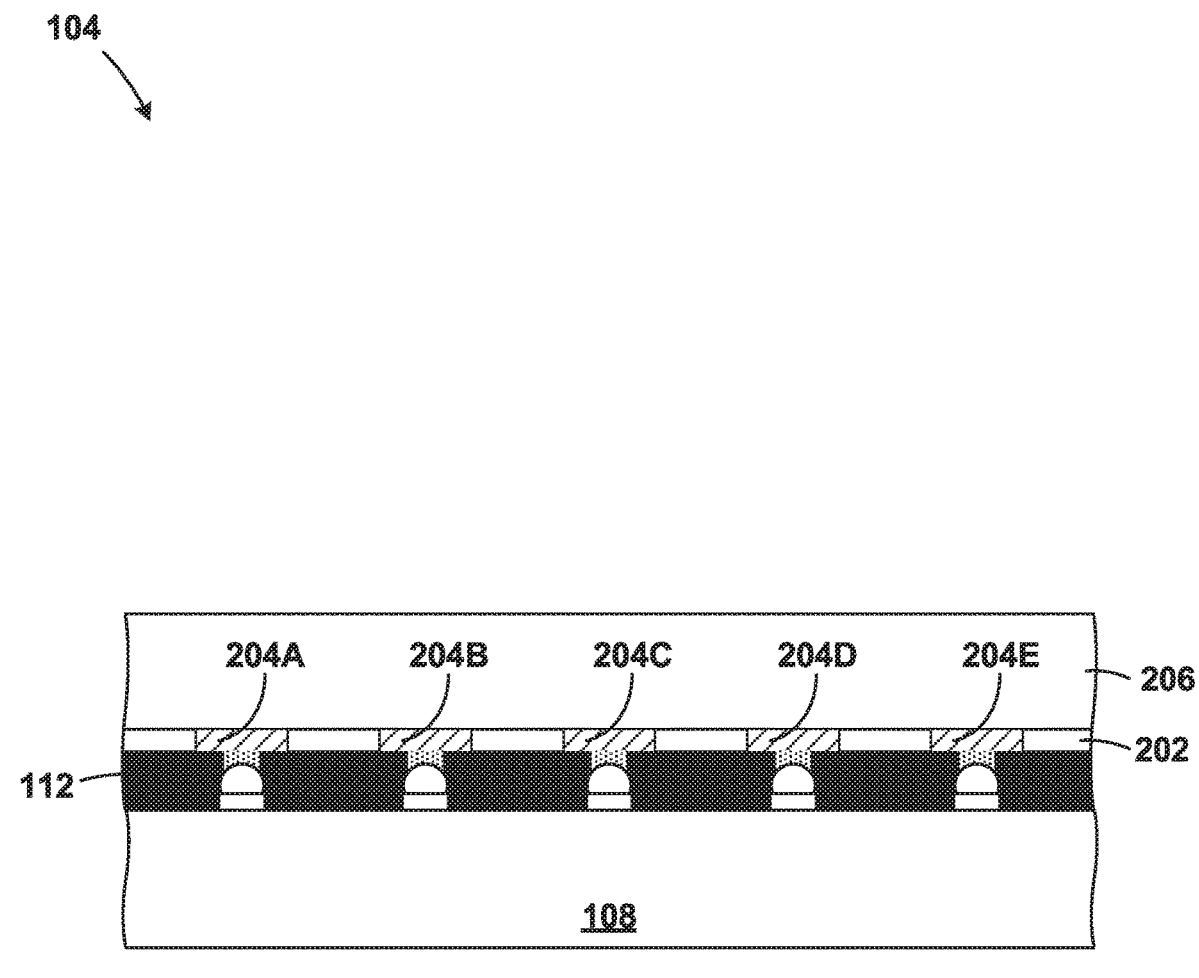
Figure 3B:
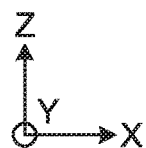

FIGS. 3A and 3B depict a section view, section A, with respect to test apparatus 100 of FIG. 1 during intermediate steps of a method of wafer testing, in accordance with an embodiment of the present invention.

As depicted in FIG. 3A, the steps may include aligning volumes 212A-E of probe card 104 with solder bumps 302A-E of wafer under test 108. In an embodiment of the present invention, electrically conductive fluid 208 may be contained within each volume 212A-E by capillary action.

With reference to FIG. 3A, aligning volumes 212A-E with solder bumps 302A-E may include spatially orienting and positioning probe card 104 with respect to wafer under test 108, wafer under test 108 with respect to probe card 104, or both. In an embodiment of the present invention, wafer under test 108 may be positioned spatially above probe card 104 for testing. In the embodiment, open ends of volumes 212A-E may face generally upwards for application with respect to solder bumps 302A-E during testing. This may help to contain electrically conductive fluid 208 with within each volume 212A-E by gravity during testing, as well as by the capillary action. In the embodiment, wafer under test 108 may otherwise be positioned spatially below probe card 104 for testing, with the open ends of volumes 212A-E facing generally downwards, for application with respect to solder bumps 302A-E during testing.

As depicted in FIG. 3B, the steps may further include driving or moving test head 102, chuck 106, or both, until electrically conductive fluid 208 contained within volumes 212A-E, makes contact and subsequently establishes the electromechanical interface with solder bumps 302A-E of wafer under test 108 for wafer testing, accordingly.

With reference to FIG. 3B, substrate 112 is deformable upon application thereof upon wafer under test 108. In an embodiment of the present invention, deformation of substrate 112 may facilitate establishment of the electromechanical interface for testing, by enabling contact of electrically conductive fluid 208 with solder bumps 302A-E, as depicted in FIG. 3B. As may be appreciated by those of skill in the art, wafer under test 108 may be inverted during testing in accordance with flip chip wafer testing, where modifications to test apparatus 100 may be made, accordingly.

Advantageously, due to the use of electrically conductive fluid 208 in conjunction with solder bumps 302A-E, substantially equal electrical resistance may be realized across the electromechanical interface, as electrically conductive fluid 208 conforms with solder bumps 302A-E.

What is claimed is:

1. A method for wafer testing, the method comprising:
loading a wafer onto a chuck of a wafer prober, the wafer comprising a plurality of solder bumps and the wafer prober comprising a test head interconnected to a probe card, wherein the probe card comprises:
a printed circuit board having wafer testing circuitry interconnected to the wafer prober; and
a probe array comprising an elastomeric slab having the plurality of probes interconnected to the wafer testing circuitry, wherein each probe comprises a volume of electrically-conductive fluid contained within a corresponding perforation of the elastomeric slab that extends between a first surface and a second surface of the elastomeric slab, wherein a first surface of each volume of electrically-conductive fluid substantially coincides with the first surface of the elastomeric slab, wherein the probe array is coupled to a bottom surface of the printed circuit board;
aligning the probe array of the probe card with respect to the plurality of solder bumps on the wafer; and
causing the plurality of probes of the probe card to contact the plurality of solder bumps of the wafer, wherein each of the plurality of solder bumps extends into the corresponding perforations in the elastomeric slab.

2. The method of claim 1, wherein the electrically-conductive fluid comprises elemental mercury.

3. The method of claim 1, wherein causing the plurality of probes of the probe card to contact the plurality of solder bumps of the wafer comprises:
contact between a second surface of each volume of electrically-conductive fluid and a surface of each solder bump, wherein the second surface of each volume is located distally with respect to the first surface.

4. The method of claim 1, wherein the volume of electrically-conductive fluid is contained within the corresponding perforation by capillary action.

5. The method of claim 1, wherein a pitch of the probe array matches a pitch of the plurality of solder bumps.

6. The method of claim 1, further comprising:
positioning the wafer below the probe card.

7. The method of claim 1, wherein aligning the probe card with respect to the wafer comprises:
moving either the probe card or the wafer with respect to the other in a plane parallel to the surface of the wafer, such that the plurality of solder bumps is aligned with the plurality of probes.

8. The method of claim 1, wherein the chuck of the wafer prober comprises a vacuum chuck.

9. The method of claim 1, wherein causing the plurality of probes of the probe card to contact the plurality of solder bumps of the wafer comprises:
moving the test head, the chuck, or both a fixed distance in a linear direction oriented perpendicular to a surface of the wafer.

10. The method of claim 1, wherein causing the plurality of probes of the probe card to contact the plurality of solder bumps of the wafer comprises:
causing the elastomeric slab of the probe array to contact a surface of the wafer between the plurality of solder bumps.

11. The method of claim 1, wherein the probe card is electromechanically interconnected to the test head by a space transformer.

12. A probe card for wafer testing, the probe card comprising:
a printed circuit board having wafer testing circuitry; and
a probe array comprising an elastomeric slab having a plurality of probes interconnected to the wafer testing circuitry, wherein each probe of the probe array comprises a volume of electrically-conductive fluid contained within a corresponding perforation of the elastomeric slab that extends between a first surface and a second surface of the elastomeric slab, wherein a first surface of each volume of electrically-conductive fluid substantially coincides with the first surface of the elastomeric slab, wherein an open end of each corresponding perforation of the probe array faces downwards.

13. The probe card of claim 12, wherein the electrically-conductive fluid comprises elemental mercury.

14. The probe card of claim 12, wherein a second surface of each volume of electrically-conductive fluid is located distally with respect to the first surface.

15. The probe card of claim 12, wherein the elastomeric slab is attached to the printed circuit board by an adhesive.

16. The probe card of claim 12, wherein the volume of electrically-conductive fluid is contained within the corresponding perforation by capillary action.

17. A probe card comprising:
a printed circuit board having wafer testing circuitry; and
an elastomeric substrate attached to a bottom surface of the printed circuit board, the elastomeric substrate comprising through holes corresponding with the wafer testing circuitry, wherein the through holes are each filled with a conductive fluid held in place by capillary action, wherein an open end of each hole faces downwards.

18. The probe card of claim 17, wherein the electrically-conductive fluid comprises elemental mercury.

19. The probe card of claim 17, wherein the slab is attached to the printed circuit board by an adhesive.

20. The probe card of claim 17, wherein the conductive fluid is in electrical contact with the wafer testing circuitry of the printed circuit board.

* * * * *